(12) United States Patent
Igarashi

(10) Patent No.: US 11,562,989 B2
(45) Date of Patent: Jan. 24, 2023

(54) LIGHT-EMITTING DEVICE AND METHOD FOR MANUFACTURING SAME

(71) Applicant: NICHIA CORPORATION, Anan (JP)

(72) Inventor: Takayuki Igarashi, Yokohama (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/580,885

(22) Filed: Sep. 24, 2019

(65) Prior Publication Data

US 2020/0098733 A1    Mar. 26, 2020

(30) Foreign Application Priority Data

Sep. 25, 2018 (JP) .............................. JP2018-178894

(51) Int. Cl.

| | |
|---|---|
| *H01L 33/00* | (2010.01) |
| *H01L 25/075* | (2006.01) |
| *H01L 33/50* | (2010.01) |
| *F21Y 115/10* | (2016.01) |
| *F21S 41/143* | (2018.01) |
| *F21S 41/20* | (2018.01) |
| *F21S 41/153* | (2018.01) |
| *F21Y 105/16* | (2016.01) |
| *B60Q 1/14* | (2006.01) |
| *F21S 45/47* | (2018.01) |

(52) U.S. Cl.
CPC ........ *H01L 25/0753* (2013.01); *H01L 33/505* (2013.01); *H01L 33/507* (2013.01); *B60Q 1/1415* (2013.01); *B60Q 2300/41* (2013.01); *B60Q 2300/42* (2013.01); *B60Q 2300/45* (2013.01); *F21S 41/143* (2018.01); *F21S 41/153* (2018.01); *F21S 41/285* (2018.01); *F21S 45/47* (2018.01); *F21Y 2105/16* (2016.08); *F21Y 2115/10* (2016.08); *H01L 2933/0041* (2013.01)

(58) Field of Classification Search
CPC ... H01L 25/0753; H01L 33/50; H01L 33/501; H01L 33/502; H01L 33/505; H01L 33/507; H01L 2933/0041; F21Y 2115/10
See application file for complete search history.

(56) References Cited

U.S. PATENT DOCUMENTS

| | | | | |
|---|---|---|---|---|
| 6,657,382 B2* | 12/2003 | Nagai | ................. | H01L 25/0753 257/E25.02 |
| 6,741,028 B2* | 5/2004 | Tanabe | ................... | H05B 33/22 313/509 |
| 6,930,332 B2* | 8/2005 | Hashimoto | ........... | H01L 33/642 257/100 |

(Continued)

FOREIGN PATENT DOCUMENTS

| | | |
|---|---|---|
| JP | 2013-084796 A | 5/2013 |
| JP | 2013-203822 A | 10/2013 |

(Continued)

*Primary Examiner* — Jay C Kim
(74) *Attorney, Agent, or Firm* — Foley & Lardner LLP

(57) ABSTRACT

A light-emitting device includes: a substrate; a plurality of light-emitting elements mounted to the substrate; and a phosphor layer provided on the plurality of light-emitting elements, the phosphor layer including: a plurality of phosphor particles, and a glass layer covering surfaces of the phosphor particles, wherein the phosphor particles are bonded to each other by the glass layer, and an air layer is formed between the phosphor particles.

13 Claims, 14 Drawing Sheets

(56) References Cited

U.S. PATENT DOCUMENTS

| | | | | |
|---|---|---|---|---|
| 6,960,878 B2* | 11/2005 | Sakano | ............. | B29C 67/08 |
| | | | | 313/512 |
| 6,964,877 B2* | 11/2005 | Chen | ............. | H01L 33/486 |
| | | | | 438/20 |
| 7,083,861 B2* | 8/2006 | Tanabe | ............. | H05B 33/20 |
| | | | | 428/690 |
| 7,157,745 B2* | 1/2007 | Blonder | ............. | H01L 33/507 |
| | | | | 257/100 |
| 7,468,145 B2* | 12/2008 | Zukawa | ............. | H01J 61/44 |
| | | | | 428/404 |
| 7,503,676 B2* | 3/2009 | Sakumoto | ............. | C09K 11/08 |
| | | | | 362/293 |
| 7,518,150 B2* | 4/2009 | Aihara | ............. | H01L 25/0753 |
| | | | | 257/103 |
| 7,541,733 B2* | 6/2009 | Ueno | ............. | C09K 11/7787 |
| | | | | 313/502 |
| 7,602,118 B2* | 10/2009 | Cok | ............. | H01L 51/5268 |
| | | | | 313/506 |
| 7,766,516 B2* | 8/2010 | Chen | ............. | G02B 5/0278 |
| | | | | 362/330 |
| 7,834,541 B2* | 11/2010 | Cok | ............. | H01L 51/5284 |
| | | | | 313/504 |
| 8,390,193 B2* | 3/2013 | Li | ............. | F21V 7/0008 |
| | | | | 313/512 |
| 8,394,654 B2* | 3/2013 | Aliyev | ............. | H01L 33/502 |
| | | | | 438/29 |
| 8,446,544 B2* | 5/2013 | Shin | ............. | H01L 25/0753 |
| | | | | 349/61 |
| 8,568,012 B2* | 10/2013 | Park | ............. | G02B 6/0023 |
| | | | | 362/612 |
| 8,724,054 B2* | 5/2014 | Jones | ............. | H01L 33/50 |
| | | | | 349/70 |
| 8,791,630 B2* | 7/2014 | Maemura | ............. | F21S 41/16 |
| | | | | 313/501 |
| 8,803,422 B2* | 8/2014 | Miyairi | ............. | H01L 25/0753 |
| | | | | 313/512 |
| 8,853,937 B2* | 10/2014 | Hsieh | ............. | B32B 9/04 |
| | | | | 313/506 |
| 8,872,210 B2* | 10/2014 | Furuyama | ............. | H01L 33/62 |
| | | | | 257/98 |
| 8,994,259 B2* | 3/2015 | Tamaki | ............. | F21V 7/00 |
| | | | | 313/483 |
| 9,006,966 B2* | 4/2015 | Chen | ............. | H05B 33/12 |
| | | | | 313/503 |
| 9,024,340 B2* | 5/2015 | Minato | ............. | H01L 33/58 |
| | | | | 257/98 |
| 9,169,994 B2* | 10/2015 | Tanaka | ............. | F21V 9/38 |
| 9,257,416 B2* | 2/2016 | Akimoto | ............. | H01L 33/50 |
| 9,406,852 B2* | 8/2016 | Nakabayashi | ............. | H01L 33/56 |
| 9,487,697 B2* | 11/2016 | Kinoshita | ............. | C09K 11/025 |
| 9,520,442 B2* | 12/2016 | Wirth | ............. | H01L 27/15 |
| 9,540,563 B2* | 1/2017 | Daimon | ............. | C09K 11/025 |
| 9,640,730 B2* | 5/2017 | Suehiro | ............. | H01L 33/46 |
| 9,741,908 B2* | 8/2017 | Yoshimura | ............. | C09K 11/7734 |
| 9,748,449 B2* | 8/2017 | Hsieh | ............. | H01L 21/6835 |
| 9,850,427 B2* | 12/2017 | Tani | ............. | C09K 11/7731 |
| 9,887,329 B2* | 2/2018 | Yamada | ............. | H01L 33/60 |
| 9,893,252 B2* | 2/2018 | He | ............. | H01L 33/60 |
| 9,972,751 B2* | 5/2018 | Saka | ............. | C23C 16/45525 |
| 9,982,867 B2* | 5/2018 | Miyata | ............. | F21V 9/32 |
| 10,074,782 B2* | 9/2018 | Kawano | ............. | C09K 11/883 |
| 10,297,730 B2* | 5/2019 | Liu | ............. | H01L 33/54 |
| 10,381,538 B2* | 8/2019 | Hayashi | ............. | H01L 33/58 |
| 10,388,838 B2* | 8/2019 | Hung | ............. | H01L 33/0075 |
| 10,418,529 B2* | 9/2019 | Gootz | ............. | H01L 33/504 |
| 10,490,711 B2* | 11/2019 | Yamamoto | ............. | H05B 33/14 |
| 10,497,681 B2* | 12/2019 | Hung | ............. | H01L 33/60 |
| 10,584,280 B2* | 3/2020 | Zhu | ............. | C09K 11/7786 |
| 10,677,407 B2* | 6/2020 | Sorg | ............. | F21S 41/176 |
| 10,797,207 B2* | 10/2020 | Estrada | ............. | H01L 33/44 |
| 10,886,437 B2* | 1/2021 | Camras | ............. | C23C 16/40 |
| 10,901,263 B2* | 1/2021 | He | ............. | G02F 1/133609 |
| 10,903,400 B2* | 1/2021 | Hiraoka | ............. | H01L 33/502 |
| 11,142,683 B2* | 10/2021 | Schmidt | ............. | C09K 11/0883 |
| 2002/0140338 A1* | 10/2002 | Sluzky | ............. | H01J 29/18 |
| | | | | 313/461 |
| 2005/0045897 A1* | 3/2005 | Chou | ............. | H01L 25/0753 |
| | | | | 257/98 |
| 2007/0125984 A1* | 6/2007 | Tian | ............. | C09K 11/7421 |
| | | | | 428/404 |
| 2008/0030986 A1* | 2/2008 | Ogawa | ............. | H01L 25/0753 |
| | | | | 362/231 |
| 2008/0238298 A1* | 10/2008 | Asai | ............. | H01J 29/20 |
| | | | | 313/503 |
| 2008/0241590 A1* | 10/2008 | Kim | ............. | C09K 11/025 |
| | | | | 428/690 |
| 2009/0091235 A1* | 4/2009 | Matsuo | ............. | H01J 61/09 |
| | | | | 313/486 |
| 2010/0148198 A1* | 6/2010 | Sugizaki | ............. | H01L 24/12 |
| | | | | 257/98 |
| 2013/0257264 A1 | 10/2013 | Tamaki et al. | | |
| 2015/0340567 A1* | 11/2015 | Ichikawa | ............. | H01L 33/58 |
| | | | | 257/98 |
| 2015/0340578 A1 | 11/2015 | Tamaki et al. | | |
| 2015/0353417 A1 | 12/2015 | Mori et al. | | |
| 2016/0149097 A1* | 5/2016 | Saka | ............. | C23C 16/4417 |
| | | | | 257/98 |
| 2016/0351762 A1* | 12/2016 | Sato | ............. | H01L 33/54 |
| 2018/0122993 A1* | 5/2018 | Camras | ............. | H01L 33/44 |
| 2018/0182937 A1 | 6/2018 | Igarashi et al. | | |
| 2020/0255729 A1* | 8/2020 | Okuno | ............. | G02B 5/20 |

FOREIGN PATENT DOCUMENTS

| | | |
|---|---|---|
| JP | 2013-229438 A | 11/2013 |
| JP | 2013-247067 A | 12/2013 |
| JP | 2014-029928 A | 2/2014 |
| JP | 2015-143324 A | 8/2015 |
| JP | 2015-220426 A | 12/2015 |
| JP | 2016-100485 A | 5/2016 |
| JP | 2016-219637 A | 12/2016 |
| JP | 2018-107355 A | 7/2018 |
| WO | WO-2018/085670 A1 | 5/2018 |

* cited by examiner

LIGHT-EMITTING DEVICE AND METHOD FOR MANUFACTURING SAME

CROSS-REFERENCE TO RELATED APPLICATIONS

This application is based upon and claims priority to Japanese Patent Application No. 2018-178894, filed on Sep. 25, 2018, the entire contents of which are incorporated herein by reference.

FIELD

The present disclosure relates to a light-emitting device and a method for manufacturing the same.

BACKGROUND

An adaptive driving beam (ADB) has been developed in recent years for automobile headlamps to irradiate light only in selected regions. By applying the ADB to a high beam, for example, light is not projected toward regions where an oncoming vehicle, a preceding vehicle, or the like exists, and light can be projected only toward other regions. The visual field of the driver of a vehicle can be realized thereby without obstructing the operation of other vehicles.

In a light-emitting device used in an ADB, for example, multiple light-emitting diodes (LEDs) are mounted to a substrate, and the light that is emitted from each LED is irradiated only in a designated direction by the optical system of the headlamp. Only selected regions are illuminated by selecting which LEDs are switched on.

For the ADB, it is desirable to reliably project light toward the regions to be lit and to reliably stop the light projection toward regions to be unlit. To this end, in the light-emitting device used for the ADB, high contrast is desirable between the unlit and lit regions.

SUMMARY

According to one embodiment, a light-emitting device includes a substrate, multiple light-emitting elements mounted to the substrate, and a phosphor layer provided on the multiple light-emitting elements. The phosphor layer includes multiple phosphor particles, and a glass layer covering surfaces of the phosphor particles. The phosphor particles are bonded to each other by the glass layer. An air layer is formed between the phosphor particles.

According to another embodiment, a method for manufacturing a light-emitting device includes spraying a slurry material onto a base body, and heating the base body having the sprayed slurry material. The base body includes a substrate and a plurality of light-emitting elements mounted to the substrate. The slurry material includes polysilazane and multiple phosphor particles. The heating of the base body is performed to convert the polysilazane into silica, cover the phosphor particles with a glass layer including the silica, and form an air layer between the phosphor particles.

According to the embodiments, a light-emitting device and a method for manufacturing the light-emitting device can be realized in which the contrast between the lit regions and unlit regions is high.

DETAILED DESCRIPTION

First Embodiment

First, a first embodiment will be described.

Figure 1:
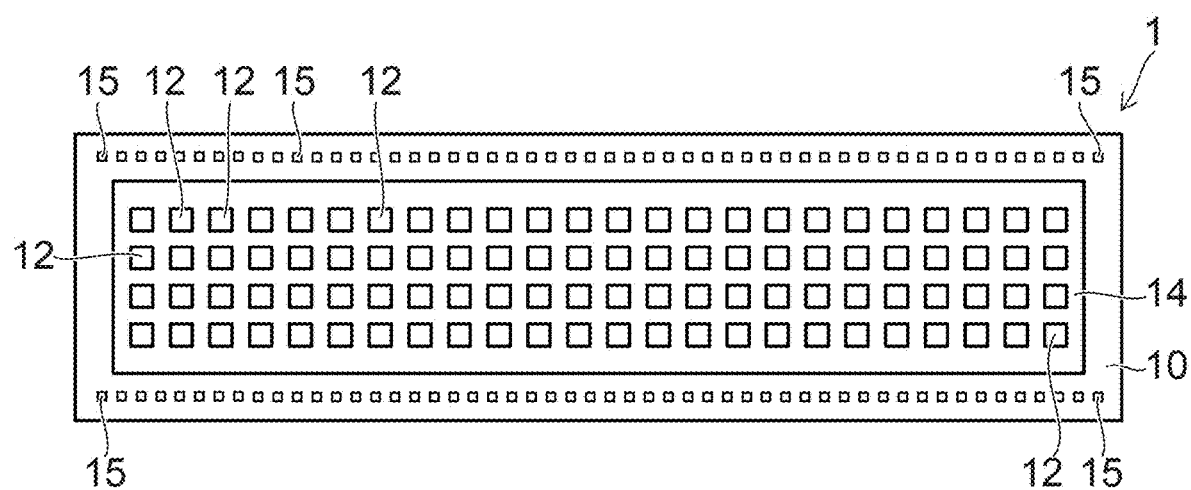
FIG. 1 is a plan view showing a light-emitting device according to a first embodiment.

FIG. 1 is a plan view showing a light-emitting device according to the first embodiment.

Figure 2:
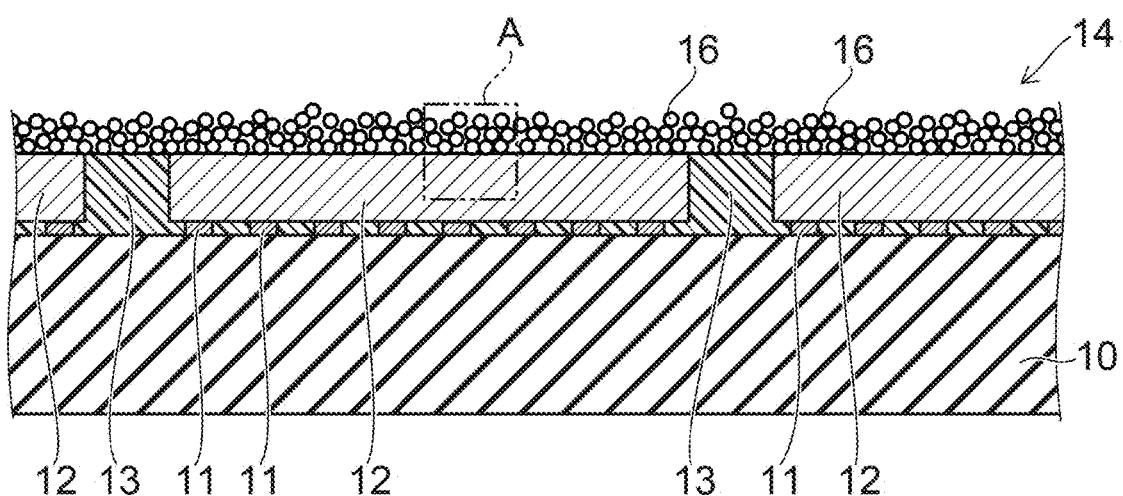
FIG. 2 is a cross-sectional view showing the light-emitting device according to the first embodiment.

FIG. 2 is a cross-sectional view showing the light-emitting device according to the first embodiment.

Figure 3:
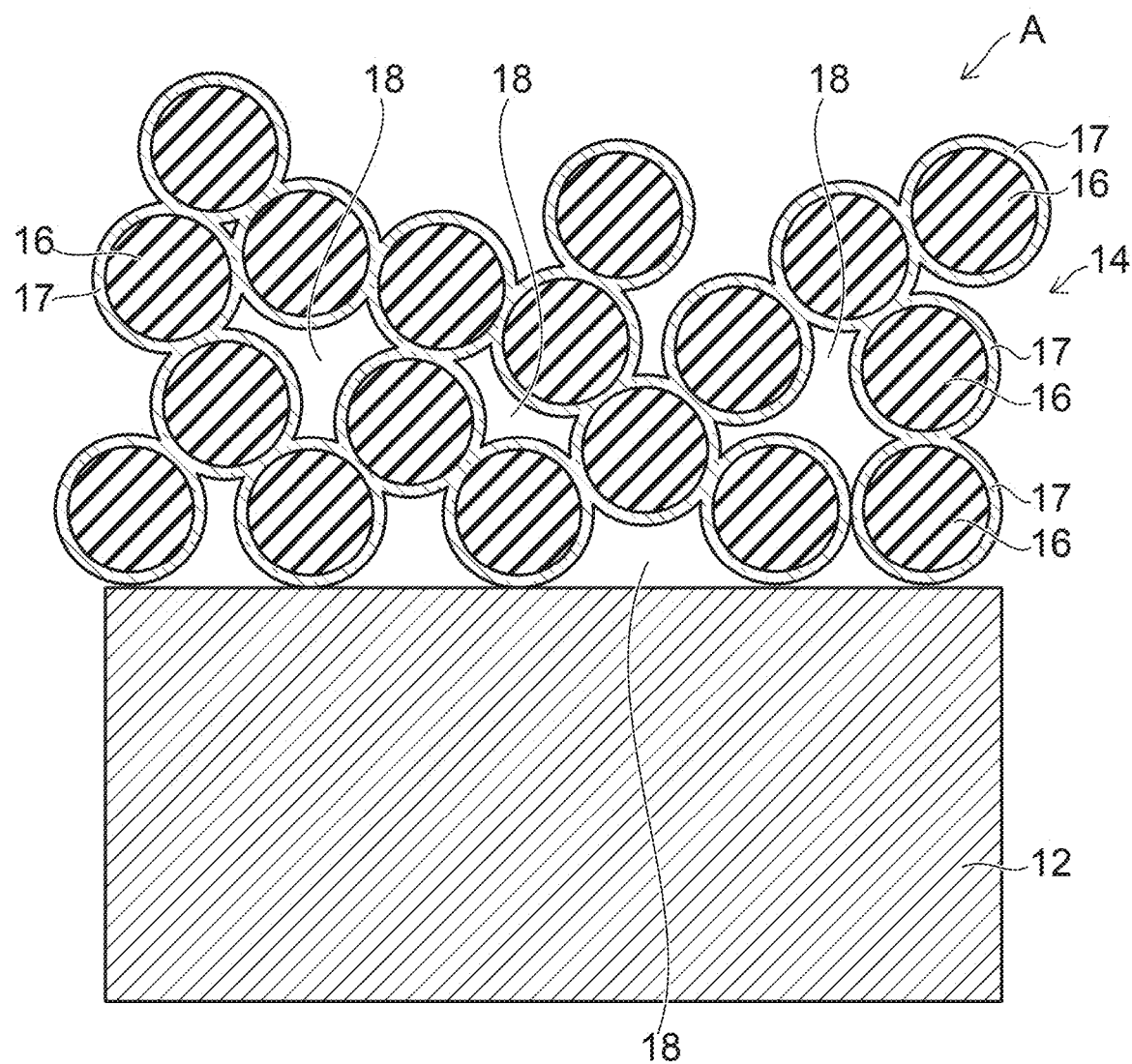
FIG. 3 is a partially enlarged cross-sectional view showing region A of FIG. 2.

FIG. 3 is a partially enlarged cross-sectional view showing region A of FIG. 2.

As shown in FIG. 1, a substrate 10 is provided in the light-emitting device 1 according to the first embodiment. The substrate 10 is a wiring substrate in which wiring (not illustrated) is provided on an insulating plate, and the insulating plate is formed of, for example, a highly heat-resistant and thermally conductive ceramic, e.g., aluminum nitride such as AlN, etc.

As shown in FIG. 1 and FIG. 2, multiple, e.g., ninety-six, light-emitting elements 12 are mounted to the upper surface of the substrate 10 by bumps 11. The light-emitting elements 12 are LED chips and emit, for example, blue light. For example, the ninety-six light-emitting elements 12 are arranged in a matrix configuration of four rows and twenty-four columns. Wire pads 15 for supplying power to the light-emitting elements 12 are provided at two sides of the region on the upper surface of the substrate 10 where the light-emitting elements 12 are mounted. For example, in the case in which ninety-six light-emitting elements 12 are provided, fifty-two wire pads 15 are provided on each side for a total of 104. Each wire pad 15 is connected to an external power supply by wire bonding. Thereby, the light-emitting elements 12 can be individually controlled one at a time.

A light-shielding layer 13 is provided between the light-emitting elements 12. The light-shielding layer 13 covers at least a portion, e.g., the entirety, of the side surfaces of the light-emitting elements 12. The light-shielding layer 13 is a layer blocking the propagation of light between the light-emitting elements 12 and may be a light-reflecting layer that reflects light or a light-absorbing layer that absorbs light. In the case in which the light-shielding layer 13 is a light-reflecting layer, for example, the light-shielding layer 13 can be formed of a white resin. When the light-shielding layer 13 is a light-reflecting layer, high contrast is maintained while increasing the light extraction efficiency, improving the luminance, and improving the luminous flux. On the other hand, in the case in which the light-shielding layer 13 is a light-absorbing layer, for example, the light-shielding layer 13 can be formed of a black resin. For example, the black resin can be formed of a silicone resin including carbon particles made of a carbon powder and/or metal particles made of aluminum (Al), etc. When the light-shielding layer 13 is a light-absorbing layer, the contrast improves even more. The light-shielding layer 13 may be formed of a resin or a ceramic of a color other than white or black. The light-shielding layer 13 is not illustrated in FIG. 1. A phosphor layer 14 is provided on the light-emitting elements 12 and the light-shielding layer 13. The phosphor layer 14 is formed to be continuous on all of the light-emitting elements 12 and on the light-shielding layer 13.

As shown in FIG. 3, multiple phosphor particles 16 are provided in the phosphor layer 14. For example, the phosphor particles 16 absorb blue light and radiate yellow light. A glass layer 17 also is provided in the phosphor layer 14. The glass layer 17 is made of silica ($SiO_2$) and covers the surfaces of the phosphor particles 16. The glass layer 17 bonds the phosphor particles 16 to each other, bonds the light-emitting elements 12 and the phosphor particles 16, phosphor particles 16 bonds the light-shielding layer 13 and the phosphor particles 16, and holds the phosphor particles 16 inside the phosphor layer 14. The glass layer 17 also protects the phosphor particles 16 from the moisture inside the air, etc. An air layer 18 is formed between the phosphor particles 16, between the light-emitting elements and the phosphor particles 16, and between the light-shielding layer 13 and the phosphor particles 16.

Examples of dimensions of the components are as follows.

The light-emitting element 12 has a flat plate configuration that is, for example, 1 mm (millimeter) long, 1 mm wide, and 150 µm (microns) high. The thickness of the phosphor layer 14 is, for example, 40 µm. The diameter of the phosphor particle 16 is, for example, in a range of 2 to 23 µm, and more specifically, for example, in a range of 5 to 15 µm. The thickness of the glass layer 17 is, for example, 1 µm.

The operation of the light-emitting device according to the first embodiment will now be described.

Figure 4:
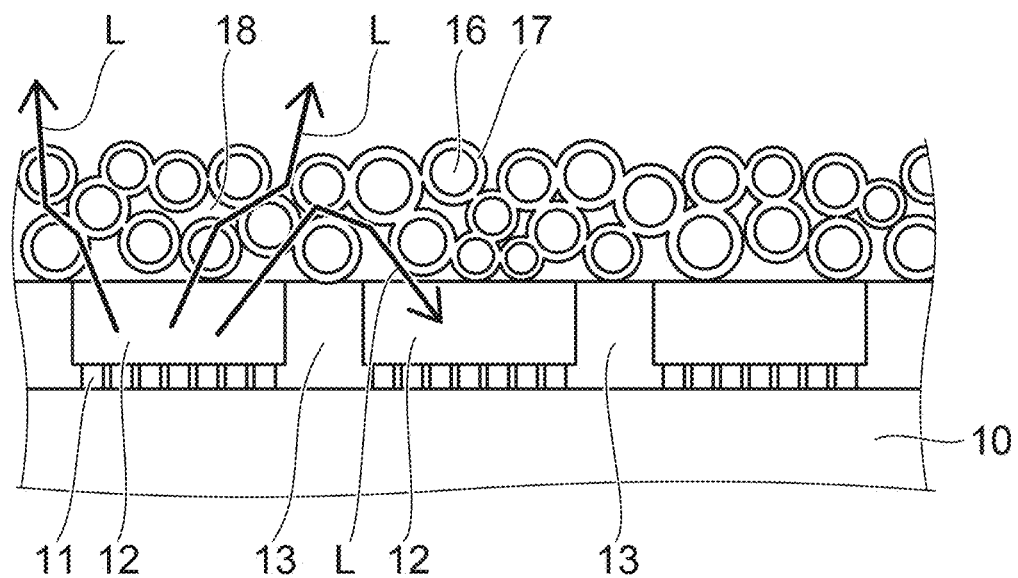
FIG. 4 is a cross-sectional view showing an operation of the light-emitting device according to the first embodiment.

FIG. 4 is a cross-sectional view showing the operation of the light-emitting device according to the first embodiment.

As shown in FIG. 4, the light-emitting element 12 emits blue light when electrical power is supplied to the light-emitting element 12 via the substrate 10. The phosphor particles 16 of the phosphor layer 14 radiate yellow light when the blue light is absorbed by the phosphor particles 16. Thereby, white light is emitted from the phosphor layer 14 as an entirety. Each light-emitting element 12 can be controlled independently. FIG. 4 shows the case in which the light-emitting element 12 on the left edge of the drawing is switched on and the other light-emitting elements 12 are switched off. Arrow-tipped zigzagging lines L shown in FIG. 4 show examples of paths of the light.

As shown by the zigzagging lines L, inside the phosphor layer 14, the blue light that is emitted from the light-emitting element 12 and the yellow light that is emitted from the phosphor particles 16 have a high probability of being reflected at the interface between the air layer 18 and the glass layer 17 when incident on the glass layer 17 from the air layer 18. Therefore, the propagation of the light inside the phosphor layer 14 in the horizontal direction, i.e., the arrangement direction of the light-emitting elements 12, is obstructed. As a result, the greater part of the blue light emitted from one light-emitting element 12 and the greater part of the yellow light radiated from the phosphor particles 16 due to this blue light are emitted from a region of the phosphor layer 14 corresponding to the region directly above the one light-emitting element 12. Accordingly, the contrast is high between the lit regions and the unlit regions when the light-emitting device 1 is viewed from the outside.

A method for manufacturing the light-emitting device according to the first embodiment will now be described.

FIG. 5A to FIG. 5D, FIG. 6, and FIG. 7A to FIG. 7C are drawings showing the method for manufacturing the light-emitting device according to the first embodiment.

Figure 5A:
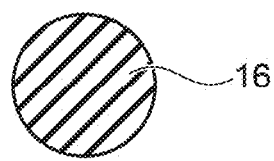
FIG. 5A to FIG. 5D, FIG. 6, and FIG. 7A to FIG. 7C are drawings showing a method for manufacturing the light-emitting device according to the first embodiment.

First, the phosphor particles 16 are prepared as shown in FIG. 5A.

Figure 5B:
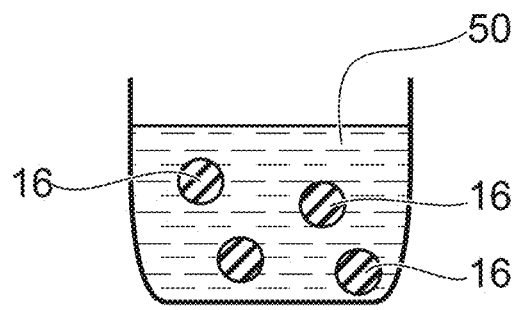
Figure 5C:
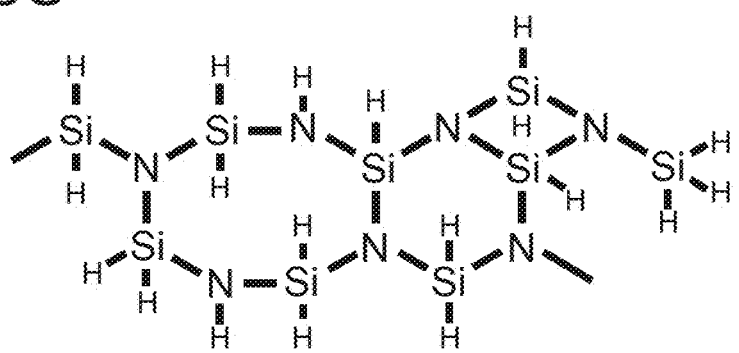

Then, as shown in FIG. 5B, a slurry material 50 is made by mixing many phosphor particles 16, polysilazane, and an organic solvent. The structural formula of polysilazane is as shown in FIG. 5C. The organic solvent includes, for example, heptane or dibutyl ether. The organic solvent may be omitted. The slurry material 50 does not include a resin material.

Figure 5D:
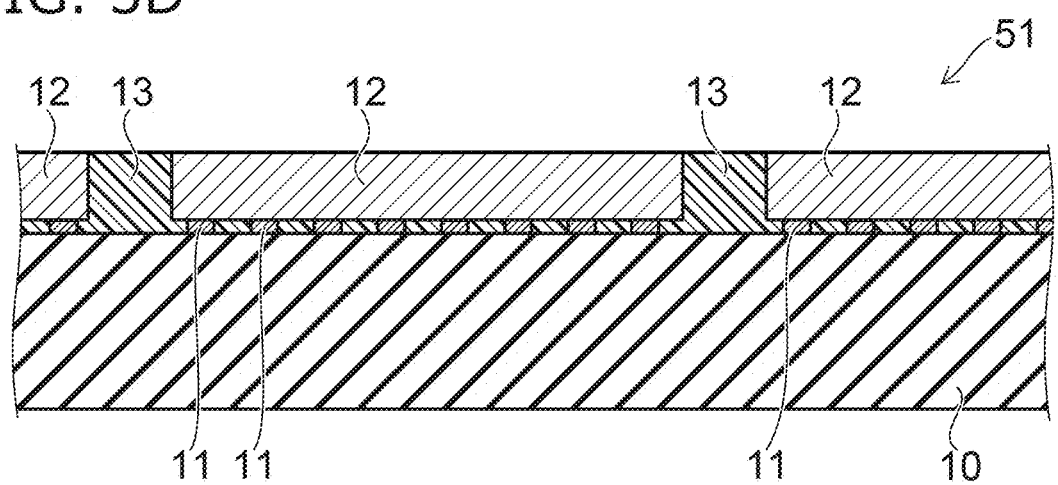

On the other hand, as shown in FIG. 5D, the multiple light-emitting elements 12 are mounted on the substrate 10 by the bumps 11. Then, the light-shielding layer 13 that is made of, for example, a white resin or a black resin is formed between the light-emitting elements 12 and at the periphery of the light-emitting elements 12. A base body 51 is made thereby.

Figure 6:
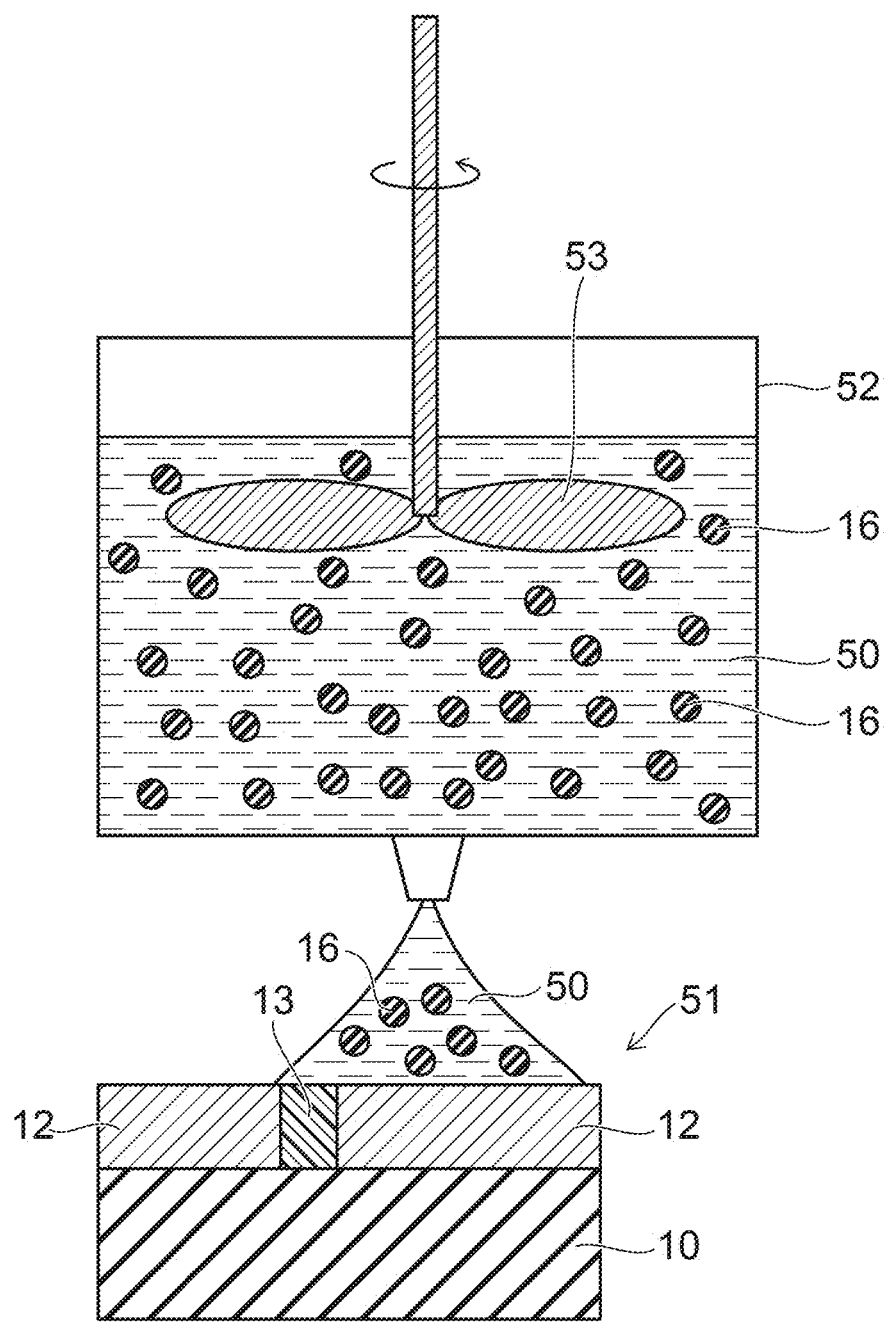

Then, as shown in FIG. 6, for example, the slurry material 50 is coated by spraying onto the base body 51 that is heated to a temperature of 60 degrees. At this time, the slurry material 50 is sprayed while stirring by a stirrer 53 inside a container 52. Thereby, the dispersion state of the phosphor particles 16 can be maintained uniformly in the slurry material 50. The organic solvent that is included in the slurry material 50 starts to evaporate directly after being sprayed onto the base body 51.

Figure 7A:
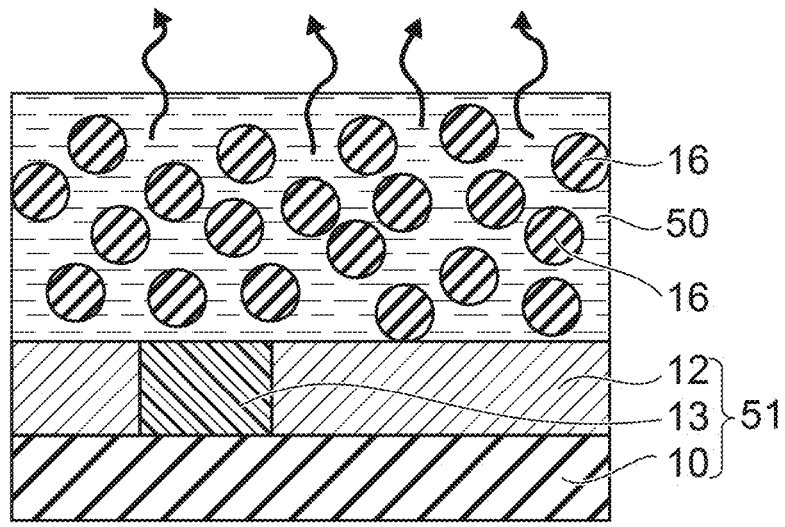

Continuing as shown in FIG. 7A, for example, the base body 51 onto which the slurry material 50 is sprayed is heated to a temperature of 180 degrees in ambient air. Thereby, the slurry material 50 is baked, the organic solvent that is included in the slurry material 50 evaporates further, and the polysilazane reacts with the moisture inside the air.

Figure 7B:
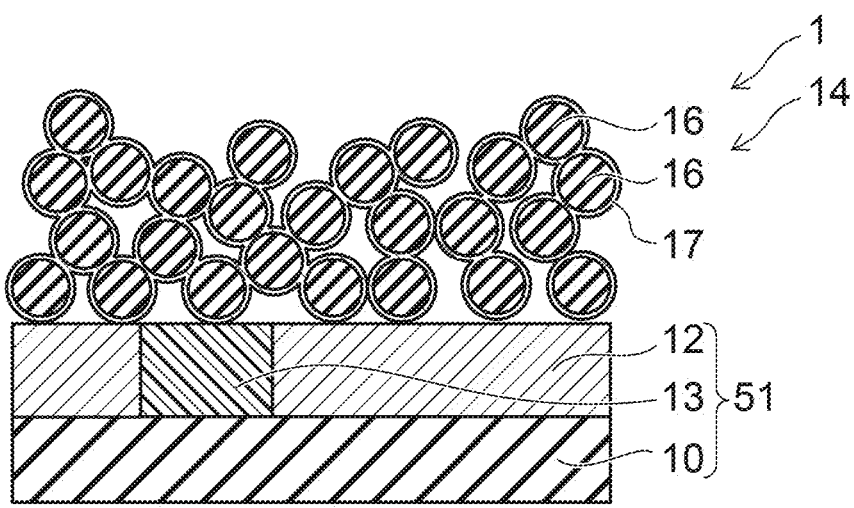
Figure 7C:
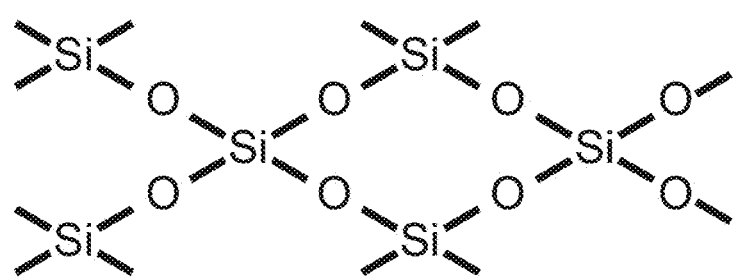

Thereby, as shown in FIG. 7B, the polysilazane is converted into silica on the surfaces of the phosphor particles 16, and the glass layer 17 is formed. The structural formula of silica is as shown in FIG. 7C. The phosphor particles 16 are bonded to each other by the glass layer 17. Also, at this stage, the organic solvent is removed substantially completely, and the air layer 18 is formed between the phosphor particles 16. As a result, the phosphor layer 14 is formed. Thus, the light-emitting device 1 according to the first embodiment is manufactured.

A usage example of the light-emitting device according to the first embodiment will now be described.

Figure 8:
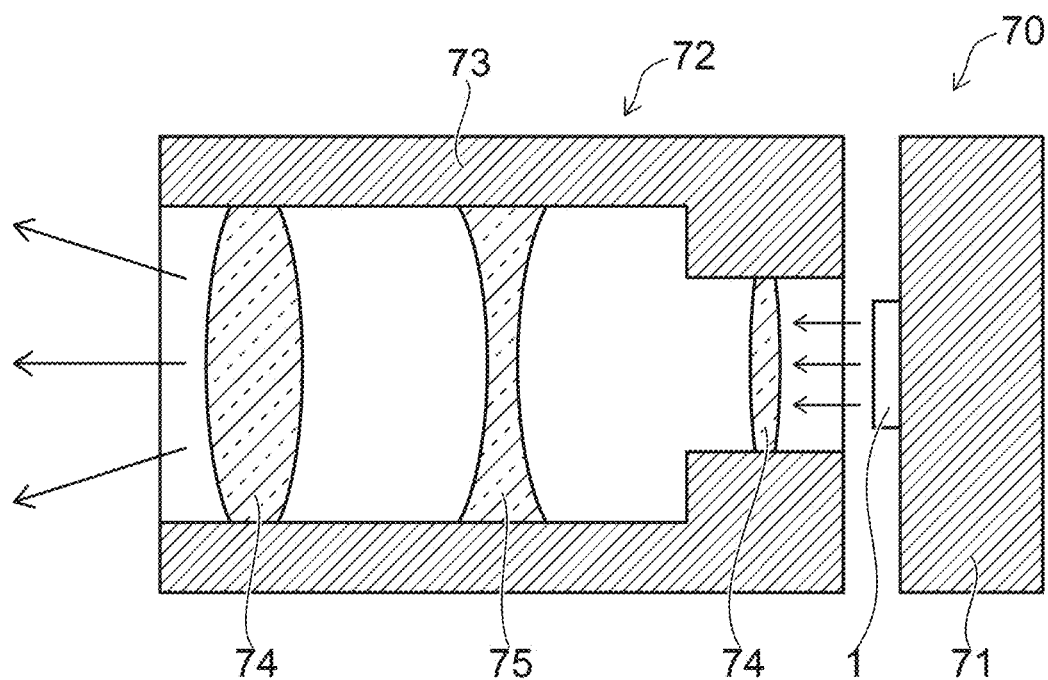
FIG. 8 is a cross-sectional view showing a high beam unit in which the light-emitting device according to the first embodiment is mounted.

FIG. 8 is a cross-sectional view showing a high beam unit in which the light-emitting device according to the first embodiment is mounted.

Figure 9:
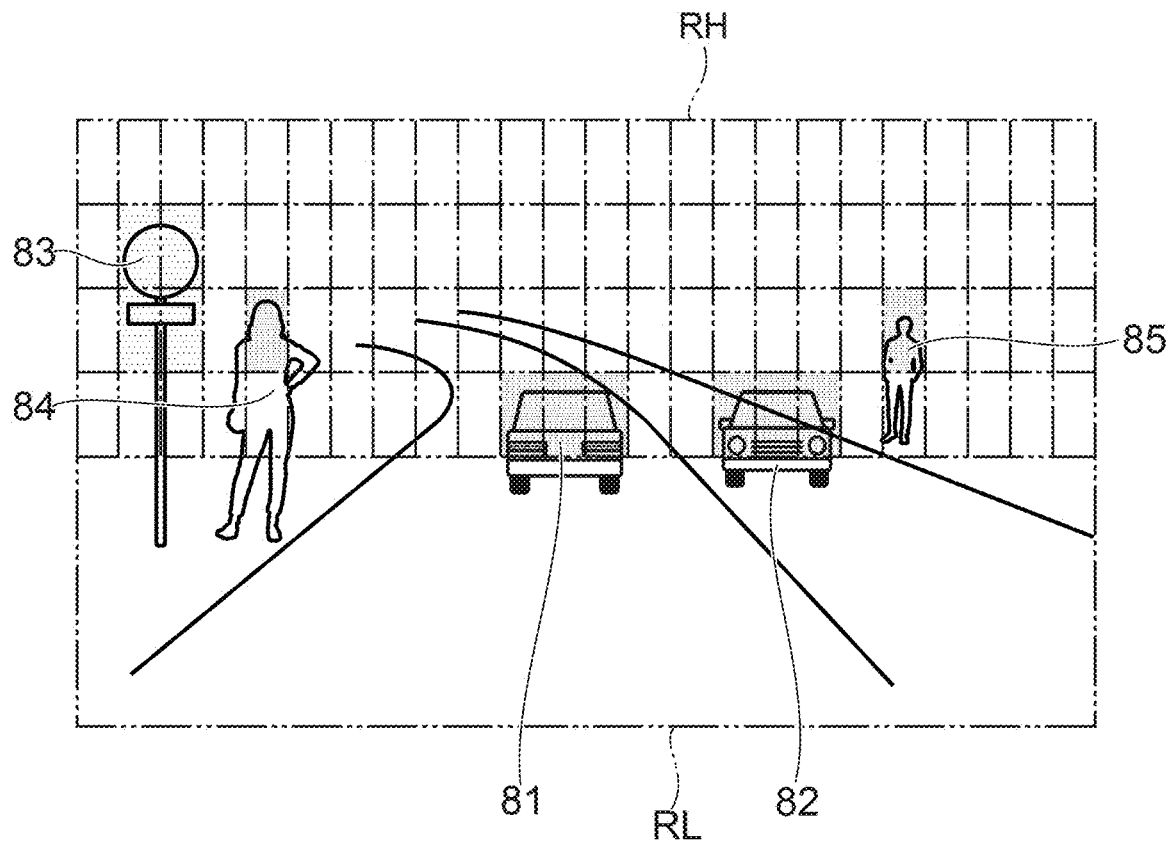
FIG. 9 is a drawing showing an operation of a headlamp in which the light-emitting device according to the first embodiment is mounted.

FIG. 9 is a drawing showing the operation of the headlamp in which the light-emitting device according to the first embodiment is mounted.

As shown in FIG. 8, the light-emitting device 1 is mounted in the high beam unit 70. A heat sink 71 is provided in the high beam unit 70, and the substrate 10 of the light-emitting device 1 (referring to FIG. 2) is bonded to the heat sink 71. An optical system 72 is provided at the light-emitting surface side of the light-emitting device 1. In the optical system 72, one or more convex lenses 74 and one or more concave lenses 75 are provided inside a housing 73. The optical system 72 emits the light entering from the light-emitting elements 12 of the light-emitting device 1 in mutually-different directions. A control circuit that individually controls the light-emitting elements 12 may be provided in the high beam unit 70. The headlamp of the automobile includes the high beam unit 70, a low beam unit, a position lamp unit, etc.

FIG. 9 is a drawing schematically showing the scenery when viewed from the driver of the automobile. As shown in FIG. 9, in the headlamp in which the light-emitting device 1 according to the first embodiment is mounted, the low beam unit is not an ADB (adaptive driving beam), and low beam unit project lights toward the entire low beam region RL.

On the other hand, the high beam unit 70 is an ADB. By switching on or switching off the light-emitting elements 12 individually in the high beam unit 70, a high beam region RH is split into the same number of regions as the light-emitting elements 12, and light can be projected selectively toward any region. For example, in the case in which ninety-six light-emitting elements 12 are arranged in a matrix configuration of four rows and twenty-four columns in the light-emitting device 1, the high beam region RH is split into four rows in the vertical direction and twenty-four columns in the horizontal direction for a total of ninety-six regions, and it can be selected whether or not to project light toward each region.

For example, in the example shown in FIG. 9, light is projected toward regions of the high beam region RH other than the rear window of a preceding vehicle 81. Light is projected toward regions other than the windshield of an oncoming vehicle 82. Reflected glare can be reduced by projecting dimmed light toward a sign 83. The existence of pedestrians 84 and 85 can be accentuated by irradiating an intense light toward the body parts without projecting light toward the heads of the pedestrians 84 and 85. Thereby, the visibility of the driver of the vehicle is improved without dazzling the driver of the preceding vehicle 81, the driver of the oncoming vehicle 82, and the pedestrians 84 and 85. The distant road also can be illuminated. The preceding vehicle 81, the oncoming vehicle 82, the sign 83, and the pedestrians 84 and 85 are recognized automatically by sensors.

Effects of the first embodiment will now be described.

In the first embodiment, the slurry material 50 that includes the phosphor particles 16 and polysilazane and does not include a resin material is made in the process shown in FIG. 5B, the slurry material 50 is sprayed onto the base body 51 in the process shown in FIG. 6, and the slurry material 50 is baked in the process shown in FIG. 7A. Thereby, the polysilazane that is included in the slurry material 50 is converted into silica. As shown in FIG. 3, the phosphor particles 16 are bonded to each other by the glass layer 17, and the air layer 18 is formed between the phosphor particles 16. As a result, as shown in FIG. 4, the propagation of the light through the phosphor layer 14 in the horizontal direction can be suppressed because the light is reflected at the interface between the air layer 18 and the glass layer 17. The contrast between the lit regions and the unlit regions of the light-emitting device 1 can be improved thereby.

Thereby, for example, when the light-emitting device 1 is used as an ADB light source as shown in FIG. 8 and FIG. 9, the luminous intensity difference between the light projection regions and the non-light projection regions can be large. This contributes to the safe operation of the automobile.

Because a resin material is not included in the slurry material 50 and the slurry material 50 is squirted by spraying, the slurry material 50 can be coated onto the entire upper surface of the base body 51 with a thin and uniform thickness. A thin and uniform phosphor layer 14 can be formed thereby. By forming the phosphor layer 14 to be thin, the propagation of the light through the phosphor layer 14 in the horizontal direction can be suppressed more effectively, and the contrast can be improved even more. Also, the uneven color of the light-emitting surface due to the thickness fluctuation of the phosphor layer can be reduced, and a more uniform irradiation surface can be obtained.

In the first embodiment, the heat from the phosphor layer 14 is dissipated easily via the light-emitting elements 12 because the phosphor layer 14 contacts the light-emitting elements 12. Temperature characteristic degradation and/or resin degradation of the phosphor particles 16 and the light-shielding layer 13 due to high temperatures can be suppressed thereby.

In the first embodiment, the phosphor layer 14 is formed of an inorganic material and does not include a resin material. Therefore, the reliability of the light-emitting device 1 according to the first embodiment is high. In particular, the reliability when operating in a high-temperature environment is high.

Second Embodiment

A second embodiment will now be described.

Figure 10:
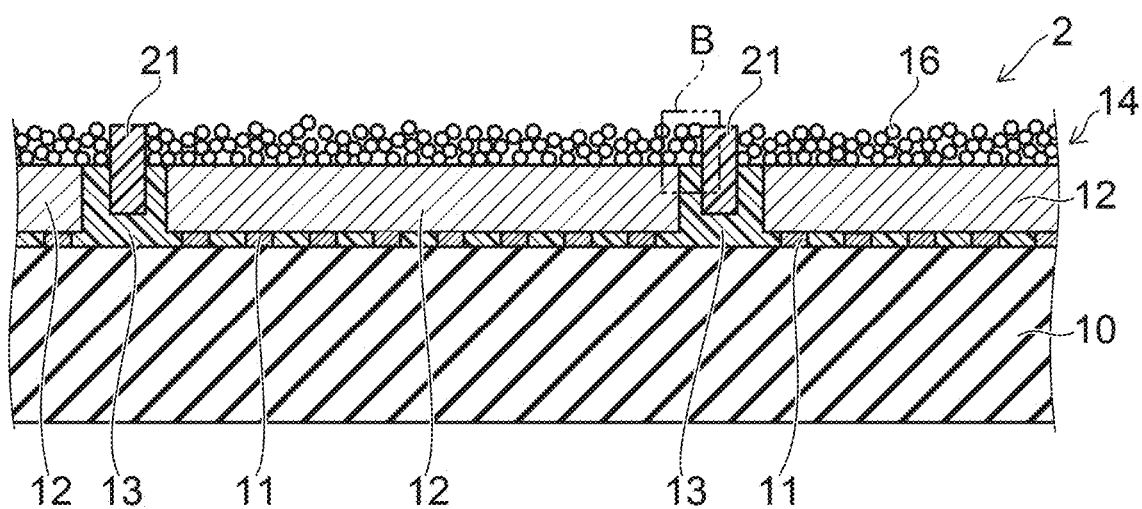
FIG. 10 is a cross-sectional view showing a light-emitting device according to a second embodiment.

FIG. 10 is a cross-sectional view showing a light-emitting device according to the second embodiment.

Figure 11:
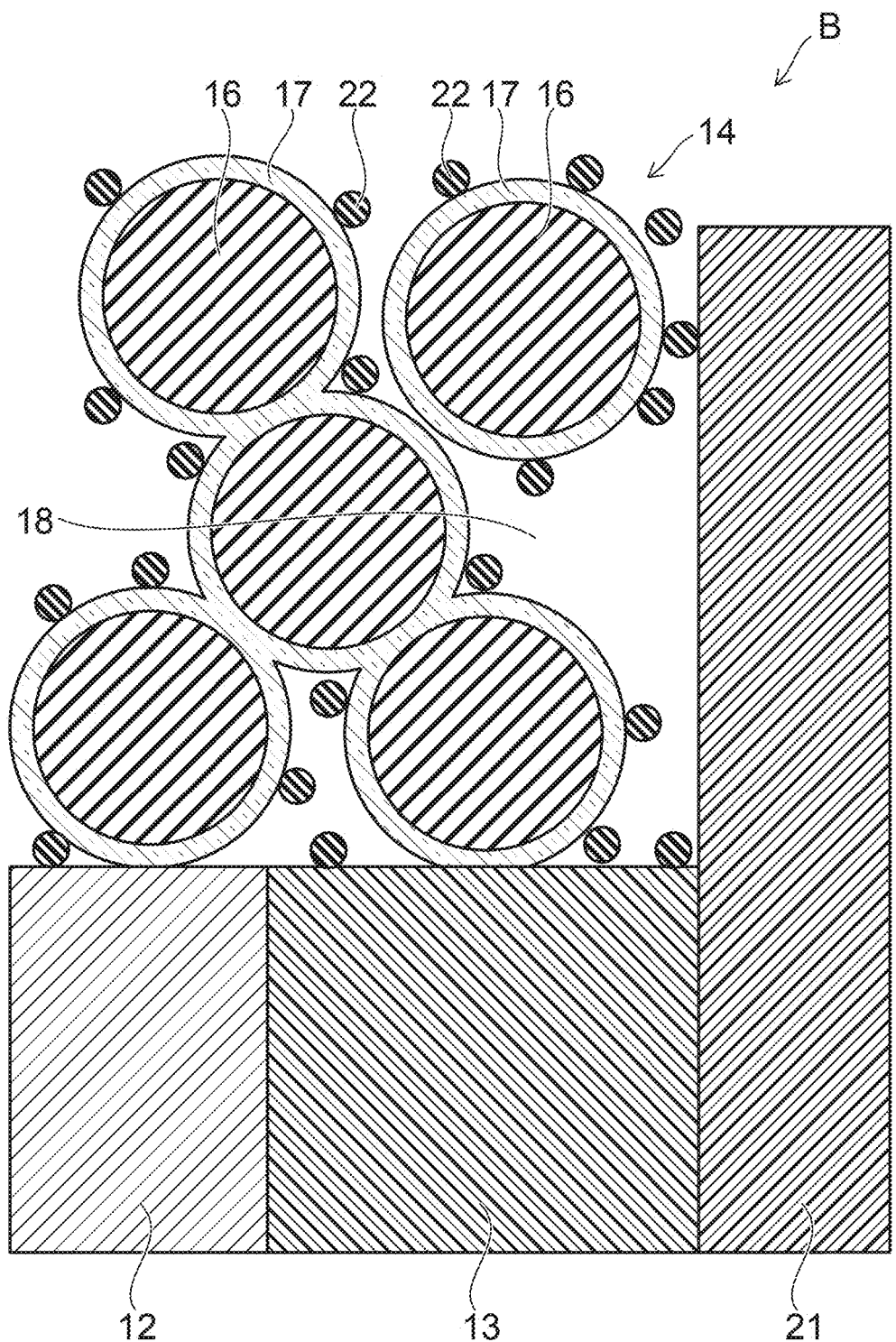
FIG. 11 is a partially enlarged cross-sectional view showing region B of FIG. 10.

FIG. 11 is a partially enlarged cross-sectional view showing region B of FIG. 10.

As shown in FIG. 10 and FIG. 11, the light-emitting device 2 according to the second embodiment differs from the light-emitting device 1 according to the first embodiment described above (referring to FIG. 1 to FIG. 3) in that a light-shielding layer 21 is provided, and the phosphor layer 14 includes a filler 22.

The light-shielding layer 21 is disposed between the light-emitting elements 12 and pierces the upper portion of the light-shielding layer 13 and the entire phosphor layer 14 in the vertical direction. Similar to the light-shielding layer 13, the light-shielding layer 21 also may be, for example, a light-reflecting layer made of a white resin or, for example, a light-absorbing layer made of a black resin. For example, by forming the light-shielding layer 13 of a white resin and by forming the light-shielding layer 21 of a black resin, both high luminance and a high contrast can be realized for the light-emitting device 2 as an entirety. The filler 22 is, for example, a ceramic particle made of silicon oxide such as $SiO_2$ or the like, titanium oxide such as $TiO_2$ or the like, aluminum oxide such as $Al_2O_3$ or the like, a metal particle made of aluminum (Al), etc.

The light-emitting device 2 according to the second embodiment can be manufactured by spraying, onto the base body 51 in the process shown in FIG. 6, the slurry material 50 into which the filler 22 is mixed in the process shown in FIG. 5B, by forming a trench by half-dicing between the light-emitting elements 12 after baking the phosphor layer 14, and by filling the light-shielding layer 21 into the trench.

In the second embodiment, the contrast can be improved even more because the phosphor layer 14 is divided for each light-emitting element 12 by the light-shielding layer 21, and the excessive phosphor particles 16 between the light-emitting elements 12 are removed.

Because the phosphor layer 14 includes the filler 22, surface modification of the phosphor layer 14 is possible. Further, because the phosphor layer 14 includes the filler 22, the viscosity of the slurry material 50 increases, and the handling of the slurry material 50 is easy. The dispersion of the phosphor particles 16 can be more uniform, and uneven coating can be reduced.

Otherwise, the configuration, the manufacturing method, the operations, and the effects of the second embodiment are similar to those of the first embodiment described above.

Third Embodiment

A third embodiment will now be described.

Figure 12:
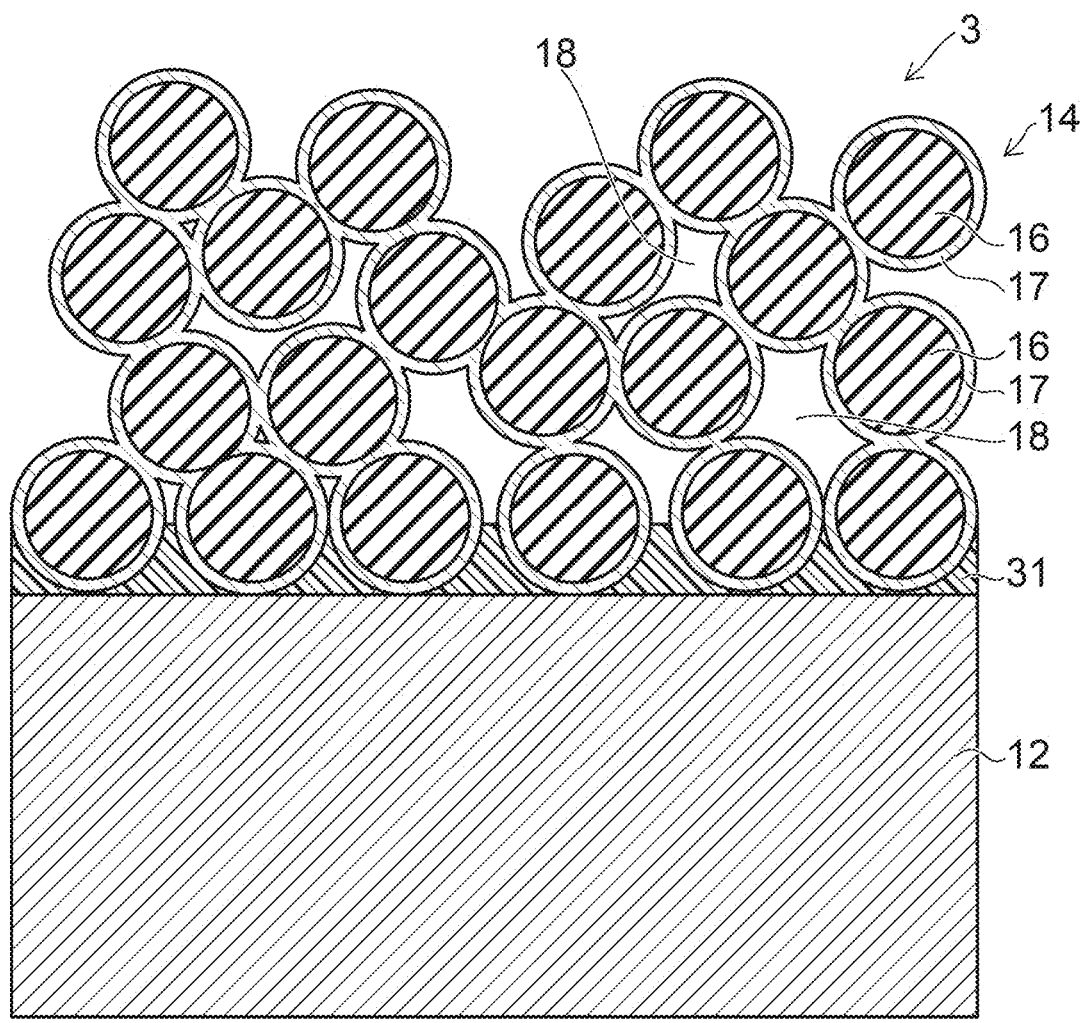
FIG. 12 is a partially enlarged cross-sectional view showing a light-emitting device according to a third embodiment.

FIG. 12 is a partially enlarged cross-sectional view showing a light-emitting device according to the third embodiment.

In the light-emitting device 3 according to the third embodiment as shown in FIG. 12, a resin layer 31 is provided in the lowermost layer portion of the phosphor layer 14. The resin layer 31 is made of, for example, a silicone resin that contacts the light-emitting elements 12 and the light-shielding layer 13. The thickness of the resin layer 31 is less than the diameter of the phosphor particle 16, e.g., 1 to 10 μm. The lower portions of the phosphor particles 16 in the lowermost level of the phosphor layer 14 are buried inside the resin layer 31.

When manufacturing the light-emitting device 3 according to the third embodiment, a resin material, e.g., a silicone resin is thinly coated as pre-processing of the spray coating after the process of making the base body 51 shown in FIG. 5D and before the process of spraying the slurry material 50 shown in FIG. 6. For example, the coating is performed by spin coating or spraying. Thereby, the resin layer 31 is formed on the upper surface of the base body 51.

As a result, when the slurry material 50 is sprayed in the process shown in FIG. 6, the lower portions of the phosphor particles 16 are buried inside the resin layer 31 for a portion of the phosphor particles 16 included in the slurry material 50. Thereby, the phosphor particles 16 can be arranged stably on the upper surface of the base body 51, and the arrangement of the phosphor particles 16 is more uniform. As a result, the fluctuation of the adhesion thickness of the phosphor particles 16 can be reduced, and the uneven color of the light emission can be suppressed.

Because the resin layer 31 is thin compared to the phosphor layer 14, the action of the light propagating in the horizontal direction is small, and the effect on the contrast is low. However, according to the design of the headlamp, there are also cases where it is desirable for some of the light inside the light-emitting device 3 to propagate in the horizontal direction. In such a case, the resin layer 31 is formed to be thick.

Otherwise, the configuration, the manufacturing method, the operations, and the effects of the third embodiment are similar to those of the first embodiment described above. Polysilazane may be coated onto the base body 51 as pre-processing of the spray coating of the slurry material 50. Thereby, a thin glass layer is formed instead of the resin layer 31. Effects similar to those of the third embodiment can be obtained thereby.

Although an example is shown in the embodiments described above in which the light-emitting device is applied to an ADB, the range of applications of the light-emitting device is not limited thereto. For example, applications to a spotlight or projection mapping are possible. In such a case, the light emission color may be different between the light-emitting elements.

The embodiments described above are examples embodying the invention, and the invention is not limited to these embodiments. For example, additions, deletions, or modifications of some of the components or processes of the embodiments described above also are included in the invention. The embodiments described above can be performed in combination with each other.

Test Example

A test example will now be described.

The test example is an example in which the light-emitting devices according to the first and second embodiments described above were observed using a microscope.

Figure 13A:
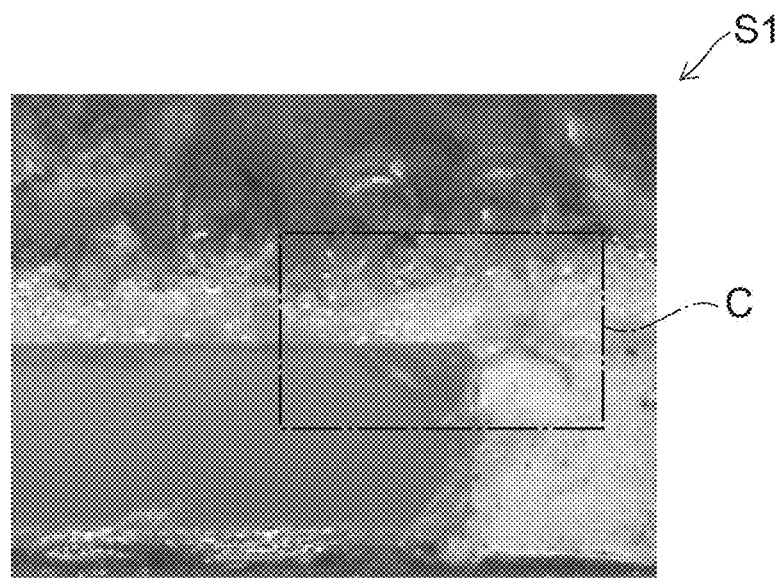
FIG. 13A is a photomicrograph of the light-emitting device according to the first embodiment.
Figure 13B:
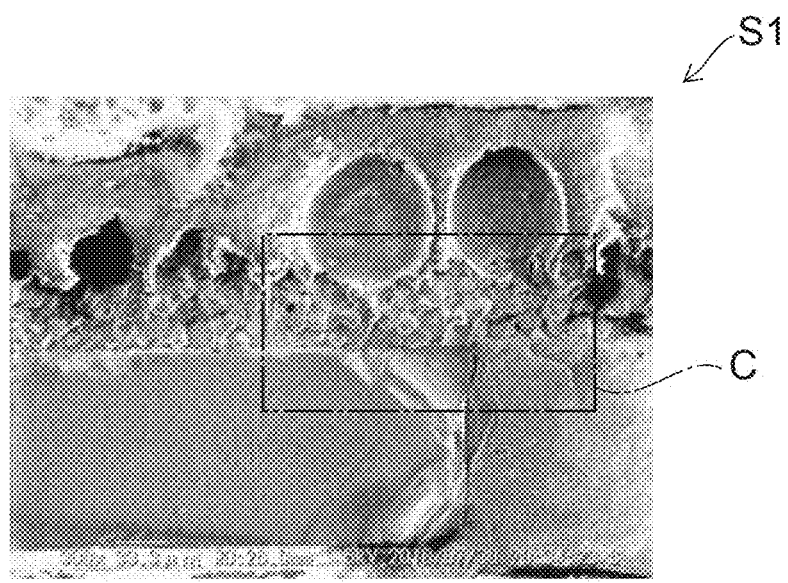
FIG. 13B is a SEM photograph of the light-emitting device according to the first embodiment.
Figure 13C:
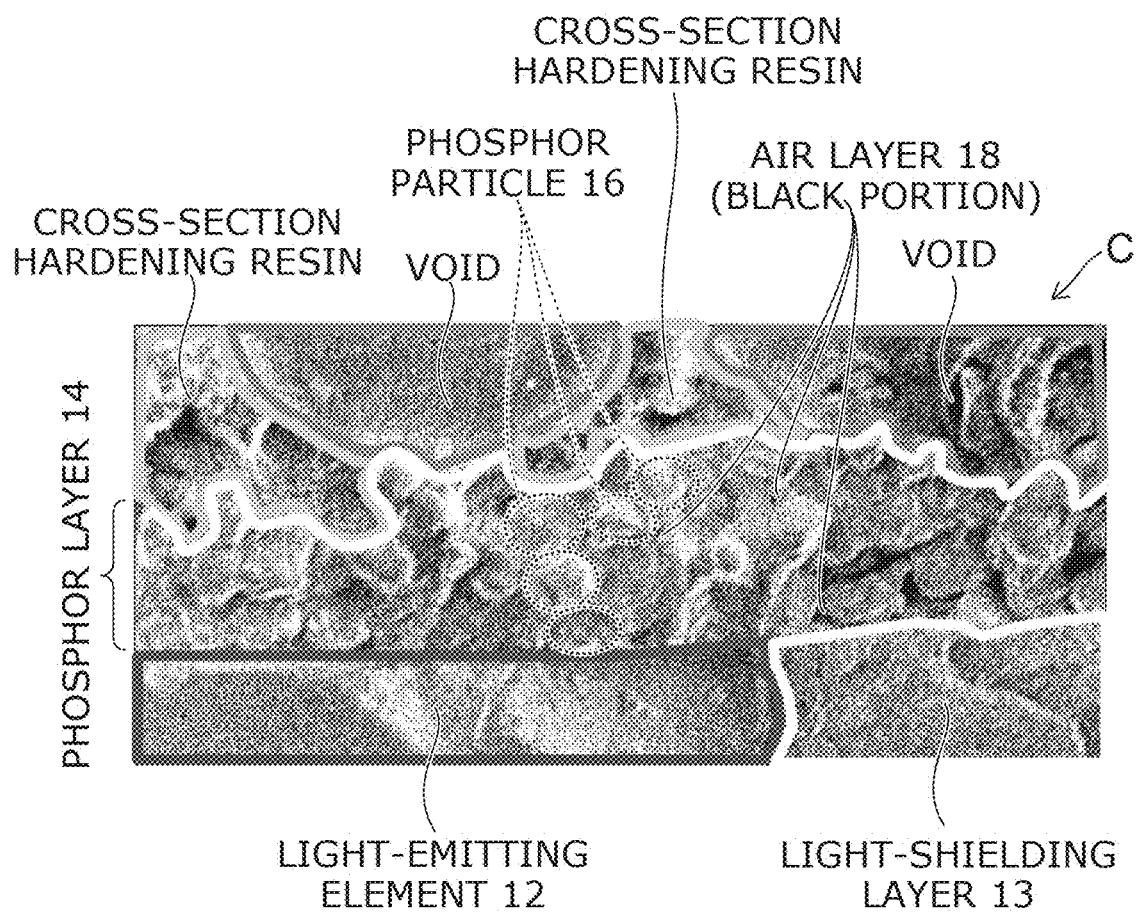
FIG. 13C is a SEM photograph of region C of FIG. 13A and FIG. 13B.

FIG. 13A is a photomicrograph of the light-emitting device according to the first embodiment; FIG. 13B is a SEM photograph of the light-emitting device according to the first embodiment; and FIG. 13C is a SEM photograph of region C of FIG. 13A and FIG. 13B.

Figure 14A:
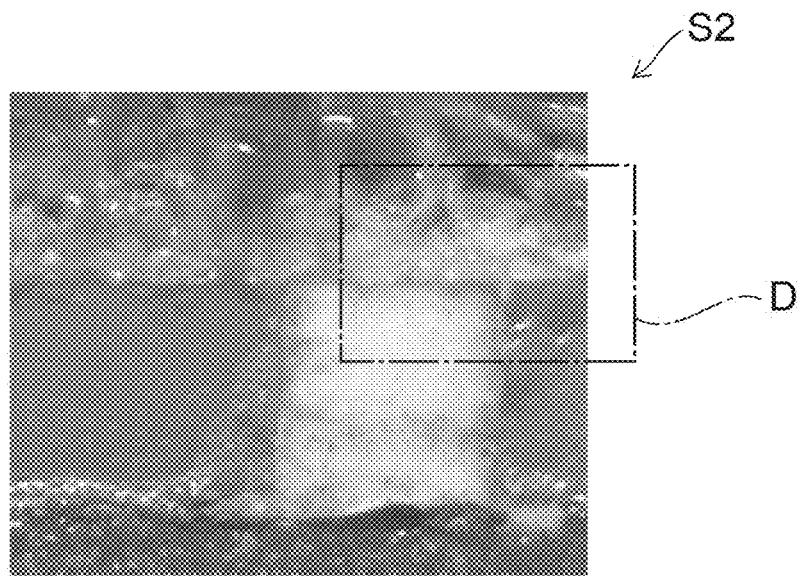
FIG. 14A is a photomicrograph of the light-emitting device according to the second embodiment.
Figure 14B:
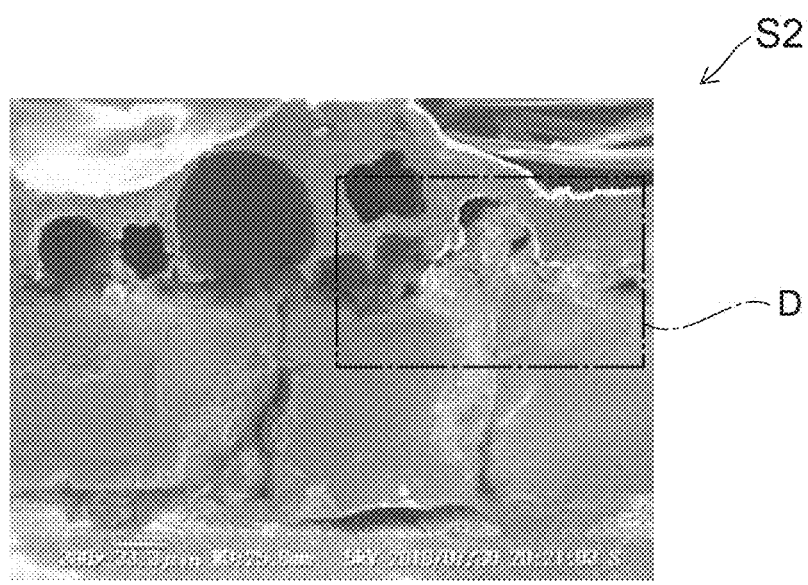
FIG. 14B is a SEM photograph of the light-emitting device according to the second embodiment.
Figure 14C:
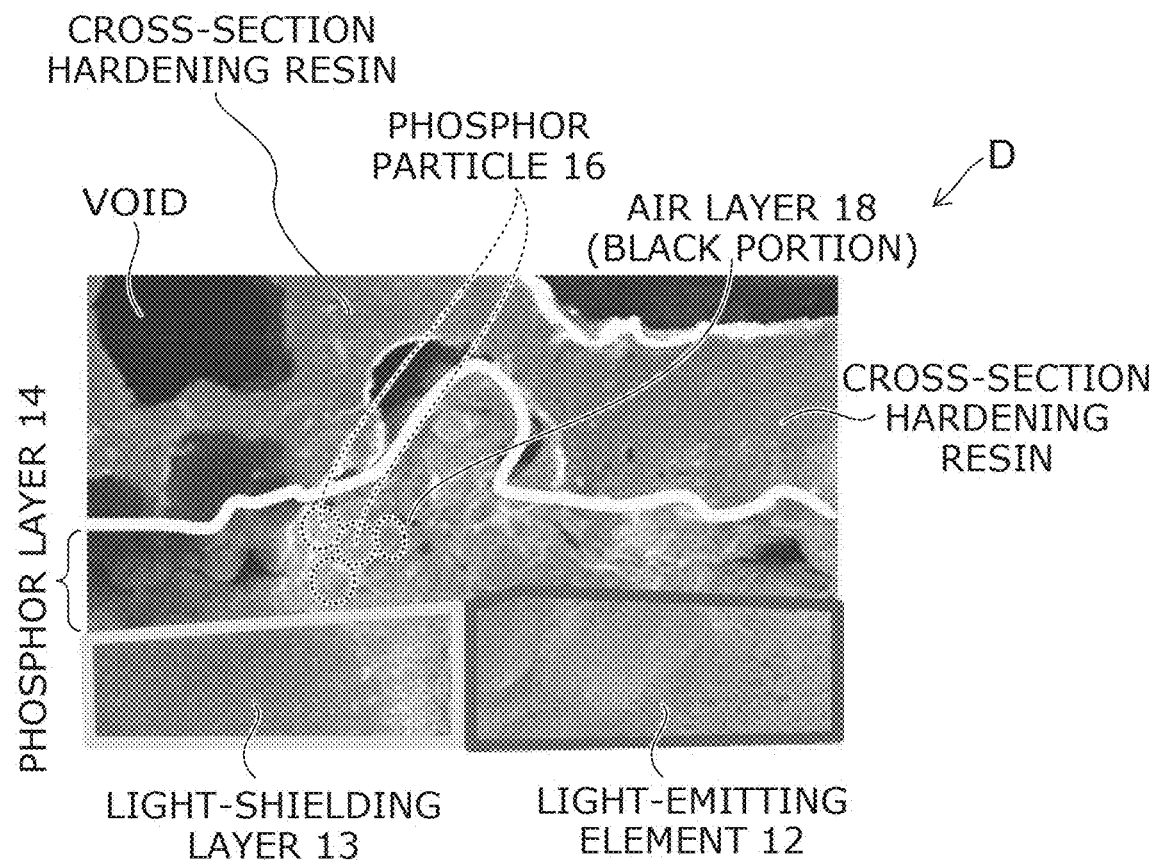
FIG. 14C is a SEM photograph of region D of FIG. 14A and FIG. 14B.

FIG. 14A is a photomicrograph of the light-emitting device according to the second embodiment; FIG. 14B is a SEM photograph of the light-emitting device according to the second embodiment; and FIG. 14C is a SEM photograph of region D of FIG. 14A and FIG. 14B.

In the test example, a sample S1 that corresponds to the light-emitting device 1 according to the first embodiment and a sample S2 that corresponds to the light-emitting device 2 according to the second embodiment were made by the method described in the first embodiment. Then, these samples were buried in a cross-section hardening resin, cut, polished, and used as samples for cross-section observation. Then, these samples were observed using an optical microscope and SEM.

In the sample S1, the light-shielding layer 13 was formed of a white silicone resin, the phosphor layer 14 was formed of a glass material and the phosphor particles 16, and the thickness of the phosphor layer 14 was set to 50 μm. The phosphor particles 16 were formed of YAG. The average particle size of the phosphor particles 16 was set to 16 μm. As shown in FIG. 13A to FIG. 13C, the air layer 18 was observed inside the phosphor layer 14 in the sample S1. The air layer 18 appears black in the SEM photograph.

In the sample S2, the light-shielding layer 13 was formed of a white silicone resin. The phosphor layer 14 was formed of a glass material, the phosphor particles 16, and a nanofiller. The thickness of the phosphor layer 14 was set to 30 μm. The mass ratio of (glass material:phosphor particle: nanofiller) in the phosphor layer 14 was set to (100:50:1). The phosphor particles 16 were formed of YAG. The average particle size of the phosphor particles 16 was set to 10 μm. The nanofiller was formed of silica. In the sample S2 as shown in FIG. 14A to FIG. 14C, the nanofiller could not be observed, but the air layer 18 was observed.

For example, the invention can be utilized in the light source of a lighting device such as a headlamp, a spotlight, or the like, a light source of a display device of projection mapping, etc.

What is claimed is:

1. A light-emitting device comprising:
a substrate;
a plurality of light-emitting elements mounted to the substrate in a matrix configuration of a plurality of rows and a plurality of columns;
a lattice-shaped light-shielding layer covering at least a portion of side surfaces of the light-emitting elements and being disposed between the plurality of light-emitting elements; and
a phosphor layer located on upper surfaces of the plurality of light-emitting elements and an upper surface of the light-shielding layer, the phosphor layer comprising:
a plurality of phosphor particles, and
a glass layer, which is a single monolithic layer that covers surfaces of the plurality of phosphor particles, wherein the phosphor particles are bonded to each other by the glass layer, and an air layer is formed between the phosphor particles.

2. The device according to claim 1, wherein the phosphor layer further comprises a filler.

3. The device according to claim 1, wherein the plurality of light-emitting elements are controllable independently from each other.

4. The device according to claim 1, wherein a thickness of the glass layer is smaller than a diameter of a first of the phosphor particles that is covered by the glass layer.

5. The device according to claim 1, wherein the glass layer includes silica.

6. The device according to claim 1, wherein the glass layer bonds at least a first of the plurality of light-emitting elements and at least a first of the plurality of phosphor particles.

7. The device according to claim 1, wherein the glass layer bonds the light-shielding layer and at least a first of the plurality of phosphor particles.

8. The device according to claim 1, wherein the air layer is formed between at least a first of the plurality of light-emitting elements and at least a first of the plurality of phosphor particles, and between the light-shielding layer and at least a second of the plurality of phosphor particles.

9. The device according to claim 1, wherein the plurality of light-emitting elements are mounted to an upper surface of the substrate by bumps.

10. The device according to claim 1, wherein the light-shielding layer is in direct contact with said at least a portion of side surfaces of the light-emitting elements.

11. The device according to claim 1, further comprising:
a plurality of wire pads configured to supply power to the plurality of light-emitting elements,
wherein the plurality of wire pads are arranged in rows at each of two sides of the light-shielding layer.

12. The device according to claim 1, wherein:
the phosphor layer is formed by:
spraying a slurry material, which comprises polysilazane and a plurality of phosphor particles, onto a base body comprising the substrate and the plurality of light-emitting elements mounted to the substrate, the slurry material comprising polysilazane and a plurality of phosphor particles, and
heating the base body on which the slurry material has been sprayed to convert the polysilazane into silica, to cover the phosphor particles with the glass layer comprising the silica, and to form the air layer between the phosphor particles.

13. The device according to claim 1, wherein the glass layer consists essentially of silica.

* * * * *